United States Patent [19]

Lee et al.

[11] Patent Number: 5,166,765

[45] Date of Patent: Nov. 24, 1992

[54] INSULATED GATE FIELD-EFFECT TRANSISTOR WITH PULSE-SHAPED DOPING

[75] Inventors: Kwing F. Lee, Red Bank; Abbas Ourmazd, Colts Neck; Ran-Hong Yan, Aberdeen, all of N.J.

[73] Assignee: AT&T Bell Laboratories, Murray Hill, N.J.

[21] Appl. No.: 749,772

[22] Filed: Aug. 26, 1991

[51] Int. Cl.$^5$ ...................... H01L 29/10; H01L 29/78
[52] U.S. Cl. ........................................ 257/345; 257/392
[58] Field of Search .............................. 357/23.3, 23.12

[56] References Cited

U.S. PATENT DOCUMENTS

| | | | |
|---|---|---|---|
| 4,242,691 | 12/1980 | Kotani et al. | 357/23.3 |
| 4,656,492 | 4/1987 | Sunami et al. | 357/23.3 |
| 4,908,681 | 3/1990 | Nishida et al. | 357/23.3 |
| 4,943,537 | 6/1989 | Harrington | 437/34 |

OTHER PUBLICATIONS

S. M. Sze, Ed., *VLSI Technology*, 2nd, McGraw-Hill Book Company, New York, 1988, pp. 88-89.
L. C. Parrillo, *Semiconductor International*, Apr. 1988, "CMOS Active and Field Device Fabrication," p. 67.
D. M. Brown, et al., *Proceedings of the IEEE* 74, Dec. 1986, "Trends in Advanced Process Technology-Submicrometer CMOS Device Design and Process Requirements," pp. 1681-1682, 1685-1686.
K. K. Young, *IEEE Trans. Electron Devices* 36, 1989, "Short-Channel Effect in Fully Depleted SOI MOSFETs," p. 399.
J. R. Brews, et al., *IEEE Electron Device Lett.* 1, 1980, "Generalized Guide for MOSFET Miniaturization," p. 2.
H. Nihira et al., *Technical Digest*, International Electron Devices Meeting, 1978, Washington, D.C., "Anomalous Drain Curent in N-MOSFET's and Its Suppression By Deep Ion Implantations," pp. 487-491.

*Primary Examiner*—Rolf Hille
*Assistant Examiner*—Robert Limanek
*Attorney, Agent, or Firm*—Martin I. Finston; Eugen E. Pacher

[57] ABSTRACT

A silicon MOSFET is provided, which can be made with an effective channel length of under one micrometer without incurring severe short-channel effects. The MOSFET includes first and second channel regions located between the source and drain regions, the first channel region overlaying the second channel region. The second channel region has a higher carrier density than the first channel region, and functions as a buried ground plane.

5 Claims, 3 Drawing Sheets

INSULATED GATE FIELD-EFFECT TRANSISTOR WITH PULSE-SHAPED DOPING

FIELD OF THE INVENTION

The invention relates to the field of silicon MOSFETs, and more particularly, to those having effective channel lengths smaller than 1 μm.

ART BACKGROUND

For many years, practitioners in the field of VLSI have strived to integrate an ever increasing number of devices, while maintaining high yield and reliability. However, as device dimensions are reduced to fractions of a micrometer, conventional MOSFET designs fail to achieve desired threshold behavior, and instead, approach ohmic behavior. This difficulty has been addressed in the prior art by increasing the doping of the channel, which tends, undesirably, both to increase the threshold voltage and to increase capacitance. These problems are particularly acute because they militate against reducing the power supply voltage, although such reduction is often desirable in order to satisfy reliability constraints. In practice, the combination of high channel doping, increased capacitance, increased threshold voltage, and reduced supply voltage imposes severe trade-offs between standby power and circuit speed.

Fully depleted silicon-on-insulator (SOI) structures have been proposed as one potential solution to these problems. (See, for example, S. M. Sze, Ed., *VLSI Technology*, 2d Edition, McGraw-Hill Book Company, New York, 1988, pp. 88–89.) In a SOI structure, the junction capacitance of the device is reduced by incorporating a thick buried oxide directly beneath the channel. Additionally, the use of a thin silicon layer relaxes the need to highly dope the channel in order to prevent punchthrough. That is, the rapid vertical modulation of the electric field, together with the concomitant large lateral potential curvature, augments the potential barrier preventing electron flow from the source. Thus, the vertical structure is used to control horizontal leakage.

However, SOI structures are not entirely satisfactory for a number of reasons. For example, the silicon film thickness in SOI structures having 0.1-μm gate lengths is only about 500 Å or even less. The precise thickness of such thin films is difficult to control with current technology. Moreover, the substrates of fully depleted, SOI MOSFETs tend to float electrically, because it is difficult to achieve good body contact to the thin silicon film. However, as the lateral electric field increases, impact-ionization-generated holes tend to become trapped within the floating body, leading to unpredictable subthreshold behavior. Still further, the wafer cost of SOI structures tend to be quite high, simply because the fabrication process is relatively complicated.

In an alternate approach, the deleterious effects of high channel doping are mitigated through the use of retrograde doping. (See, for example, L. C. Parrillo, "CMOS Active and Field Device Fabrication," *Semiconductor International* (April 1988) p. 67; and D. M. Brown, et al., "Trends in Advanced Process Technology—Submicrometer CMOS Device Design and Process Requirement," *Proceedings of the IEEE* 74 (December 1986) pp. 1681-1682, 1685-1686. In retrograde doping, a high-energy well implant is used to create a zone of peak dopant concentration that lies below the MOS device region. Punchthrough tends to be suppressed, e.g., because the high doping density reduces the lateral extent of the drain depletion region, preventing the drain field from penetrating into the source region.

However, conventional retrograde doped structures suffer certain disadvantages as well. For example, the high-level doping typically extends more deeply than the junction. As a result, the junction capacitance can still be intolerably high, even though the surface filed may be reduced. Moreover, the exact position of the high doping region, as taught in the prior art, is somewhat arbitrary. However, the precise placement of that region is critically important to the operation of deep submicron devices. Still further, the presence of high-level doping beneath the source and drain regions of conventional retrograde doped structures may contribute undesirable junction capacitance.

Thus, practitioners in the field have hitherto failed to provide a silicon MOSFET design which offers all of the advantages of SOI designs, while preserving the simplicity and cost-effectiveness of conventional VLSI fabrication techniques.

SUMMARY OF THE INVENTION

We have discovered a MOSFET design which can be implemented on a silicon substrate and incorporated in an integrated circuit on such substrate, and which can be miniaturized into the submicron regime without incurring severe short-channel effects. The inventive MOSFET includes a gate oxide layer of thickness $t_{ox}$ overlying a portion of the substrate; a source region, and a drain region spaced from the source region, each defined in a portion of the substrate and extending to a junction depth $t_j$ beneath the principal surface; and first and second channel regions defined within the substrate and located between the source and drain regions. The first channel region at least partially overlies the second channel region, and the gate oxide layer overlies the first channel region. The first channel region extends from the substrate surface to a depth, to be referred to as $t_{Si}$, which is less than or equal to about 500 Å, and the second channel region extends substantially from $t_{Si}$ to a depth that is is less than or equal to about $t_j$. The room-temperature carrier density in the first channel region is less than about $2 \times 10^{17}$ cm$^{-3}$, and the room-temperature carrier density in the second channel region is greater than about $5 \times 10^{17}$ cm$^{-3}$.

DETAILED DESCRIPTION

According to a well-known mathematical model described in K. K. Young, "Short-Channel Effect in Fully Depleted SOI MOSFETs," *IEEE Trans. Electron Devices* 36 (1989) p. 399, the potential distribution in the channel region of an SOI structure can be described in terms of a natural length scale $\lambda_{SOI}$. Let $\Phi(x,y)$ denote the potential, where x represents the horizontal (i.e., source-to-drain) direction, and y represents the vertical (i.e., perpendicular to the substrate surface) direction. Significantly, y is equal to zero at the interface between the silicon channel and the gate oxide, and increases with depth into the substrate. Assume that $\Phi(x,y)$ can be expressed as a second-order polynomial in y, with each coefficient a function of x. When this expression is substituted into Poisson's equation subject to appropriate boundary conditions, a new mathematical expression of great simplicity emerges. Let $\Phi_f(x,y)$ evaluated at y=0, let the scale length $\lambda_{SOI}$ be defined by $$\lambda_{SOI} = \sqrt{\frac{\epsilon_{Si}}{\epsilon_{ox}} t_{Si} t_{ox}},$$

and let $\phi(x)$ be defined by $$\phi(x) = \Phi_f(x) - \Phi_{gs} + (qN_A/\epsilon_{Si})\lambda^2_{SOI},$$

where $\epsilon_{Si}$ denotes the dielectric constant of silicon, $\epsilon_{ox}$ denotes the dielectric constant of the gate oxide, $t_{Si}$ denotes the thickness of the silicon film in the SOI structure, $t_{ox}$ denotes the thickness of the gate oxide, q denotes the magnitude of the electronic charge, $\Phi_{gs}$ denotes the potential difference between the gate and the source, and $N_A$ denotes the channel doping density.

Then the horizontal variation of $\phi(x)$ is found to obey the equation:

$$\frac{d^2\phi(x)}{dx^2} - \frac{\phi(x)}{\lambda^2_{SOI}} = 0 \tag{1}$$

It is this respect that the natural length scale $\lambda$ emerges. We have found that in order for an SOI device having an effective channel length $L_{eff}$ to operate substantially free of short-channel effects such as punchthrough, the ratio $\lambda_{SOI}/L_{eff}$ should be no more than about 0.1–0.2, although specific applications will dictate more precisely what ratio is small enough.

We have applied a similar theoretical analysis to a structure, the "ground plane" structure, which has different boundary conditions than the SOI structure. As discussed below, we have discovered not only that the ground plane structure is at least as effective as the SOI structure for reducing $\lambda$, but also that it can be practically realized in bulk silicon.

Figure 1:
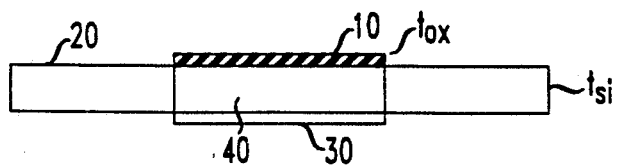
FIG. 1 is a schematic representation of an idealized ground plane structure for a MOSFET.

The ground plane structure is depicted schematically in FIG. 1. As is apparent from the figure, a gate oxide layer 10 overlies a silicon layer 20. A portion of the silicon layer overlies a buried ground plane 30. Significantly (for the purposes of this idealized picture), the lateral dimensions of the gate oxide, the channel region 40, and the ground plane are assumed to be identical. The ground plane is considered to be maintained at a fixed potential, exemplarily ground potential.

We have found that such a structure has a natural length scale $\lambda$, analogous to $\lambda_{SOI}$, which is approximately given by:

$$\lambda = \sqrt{\frac{\epsilon_{Si}}{2\epsilon_{ox}} \frac{t_{Si}t_{ox}}{1 + \frac{\epsilon_{Si}t_{ox}}{\epsilon_{ox}t_{Si}}}} \tag{2}$$

In the long channel regime, i.e., where $\lambda$ is less than about $0.2L_{eff}$, the threshold voltage $V_{th}$ for this structure, in e.g., an NMOS device, is approximately given by:

$$V_{th} = qN_A t_{Si} t_{ox}/2\epsilon_{Si} + (\epsilon_{Si}/\epsilon_{ox})(t_{ox}/t_{Si})V_{bi}, \tag{3}$$

where $V_{bi}$ denotes the built-in voltage between the n+ source or drain (assuming the device is NMOS) and the channel. It should be noted that the second term in this expression is due to the ground-plane configuration.

We have compared $\lambda_{SOI}$ to $\lambda$ for respective SOI and ground plane structures having exemplary gate oxide thickness of 40 Å and exemplary silicon film thickness of 250 521. For the fully depleted SOI structure, $\lambda_{SOI}$ was 175 Å, whereas for the ground plane structure, $\lambda$ was only 101 Å.

Figure 2:
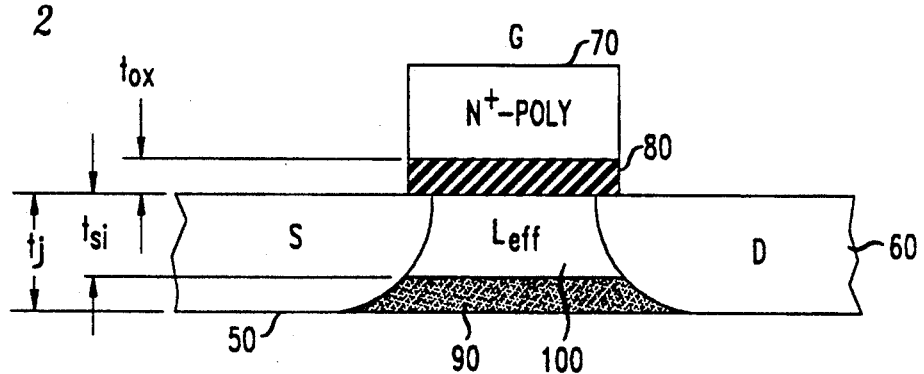
FIG. 2 is a schematic representation of a practical realization of the structure of FIG. 1.

Depicted in FIG. 2 is an exemplary implementation of the ground plane structure in bulk silicon. Included in the figure are source 50, drain 60, polysilicon gate electrode 70, gate oxide 80, ground plane 90, and compensated channel region 100. Region 100 is analogous to channel region 40 of FIG. 1.

Figure 3:
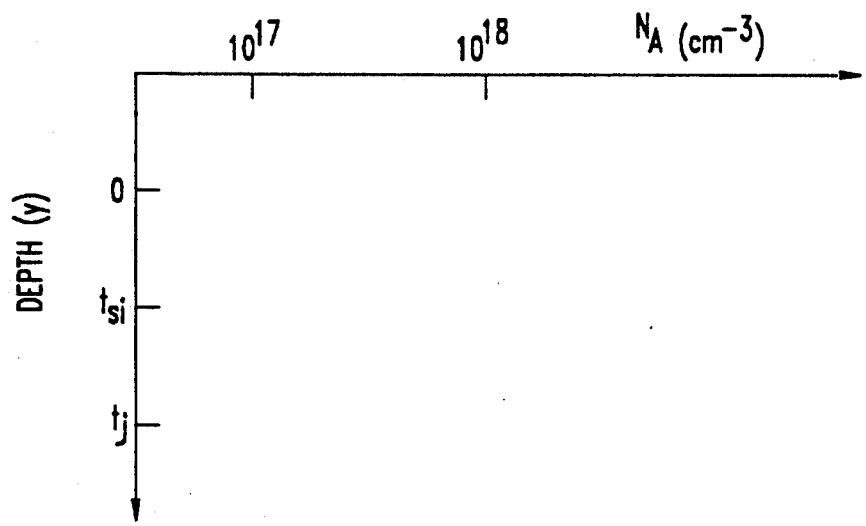
FIG. 3 is a graph of an idealized doping profile for the structure of FIG. 2.

Depicted in FIG. 3 is an exemplary schematic doping for the structure of FIG. 2. Because the doping profile resembles a spatial pulse, we describe the ground plane structure, in its preferred embodiment, as "pulse-shaped doped (PSD)". It should be noted, however, that due to dopant diffusion and other physical effects occurring during processing, an actual doping profile is likely to exhibit some spreading, and thus to deviate form an idealized rectangular pulse shape.

It should be noted that the invention is not limited to devices having channels of a particular conductivity type, but, rather, is generally applicable to PMOS, NMOS, CMOS, and related technologies. For illustrative purposes, we describe, below, a currently preferred method for making an NMOS device which embodies the invention.

At least one self-aligned, silicon-gate, ion-implanted, enhancement-mode NMOS transistor structure is formed by conventional techniques on a lightly doped p-type (100)-silicon wafer coated with conventional layers of, respectively, thermal silicon dioxide and silicon nitride. After lithographic patterning of the silicon nitride, a high-energy boron-ion implant is performed to create channel-stop regions. The field oxide is grown, the silicon nitride is stripped, and the gate oxide is grown, all according to conventional techniques.

Typically, ion implantation is then performed through the gate oxide. (Ion implantation is optionally performed before gate oxide formation.) The specific implantation steps that are performed represent a departure from the prior art, and result in a structure which exhibits behavior characteristic of the buried ground plane.

Exemplarily, boron ions are implanted at an energy of about 2 keV and a flux of about $2 \times 10^{13}$ cm$^{-2}$, resulting in a doping profile extending from about 100 Å to about 500 Å, and having an average doping density of about $10^{18}$ cm$^{-3}$. A second implant is then performed in, exemplarily, three steps using arsenic ions at respective energies of about 10, 20, and 40 keV and respective fluxes of about 2, 8, and $30 \times 10^{11}$ cm$^{-2}$. The arsenic ions are stopped in the first approximately 250 Å of the silicon channel. As a result, this region is doped to an arsenic ion density of about $10^{18}$ cm$^{-3}$. The purpose of the arsenic is to compensate the boron doping in the arsenic-implanted region, such that the carrier density in that region is reduced to a level near the intrinsic carrier density (at room temperature). Typically, the compensated carrier density will be about $10^{17}$ cm$^{-3}$. By contrast, the uncompensated, boron-doped region will typically have a carrier density (at room temperature) of about $10^{18}$ cm$^{-3}$. It should be noted in this regard that the exact implantation conditions will depend on the actual thermal treatment of the substrate during the entire process. Moreover, variations of the exemplary procedure here described will be apparent to the skilled practitioner, in which, for example, the number of separate boron implantation steps is not limited to a single step, and the number of separate arsenic implantation steps is not limited to three.

Polysilicon gates are next conventionally deposited and patterned. Insulating sidewalls are optionally formed, and then source and drain implants are performed according to conventional techniques. A metal silicide is conventionally formed on the gate, source, and drain areas, and then an insulating dielectric layer is deposited and contact windows are opened on the source, drain, and gate, This is followed by conventional deposition and patterning of a metallization layer.

The buried ground plane (region 90 of FIG. 2) is embodied in the uncompensated, boron-doped region lying below the arsenic-implanted region (region 100 of FIG. 2) within the channel. In preferred embodiments, the buried ground plane is laterally confined between the source and drain regions, and is no longer than the written channel length. The top of the buried ground plane is defined by the bottom of the compensated region. The bottom of the buried ground plane is preferably no deeper than the source and drain junction depth, which is typically about 1500 Å. In this regard, a portion of the channel is considered to lie outside the buried ground plane if it has a carrier density (at room temperature, i.e., 20° C.) that is less than 10% of the peak carrier density in the buried ground plane.

The depth of the compensated region, which corresponds to the dimension $t_{Si}$, is preferably at least about 150 Å, but not more than about 500 Å. (As noted, a typical thickness is about 250 Å.) The junction depths are preferably no more than about 1000 Å. Accordingly, in preferred embodiments, the buried ground plane lies between a depth of about 500 Å or less, and a depth of about 1000 Å or less.

According to our current understanding, transistors are readily fabricated by this technique with effective channel lengths as small as 0.10 μm–0.15 μm, and even as small as 0.075 μm, and with λ no greater than 0.2 times the effective channel length. (Written channel lengths corresponding to effective channel lengths of 0.075–0.10 μm would typically lie in the approximate range 0.10–0.15 μm.) According to Equation 2, the value of λ is determined by the selection of the dimensions $t_{ox}$ and $t_{Si}$. Thus, for an exemplary gate oxide thickness of 40 Å, a λ value of 250 Å is obtained when $t_{Si}=500$ Å, and a λ value of 175 Å is obtained when $t_{Si}=250$ Å.

Figure 4:
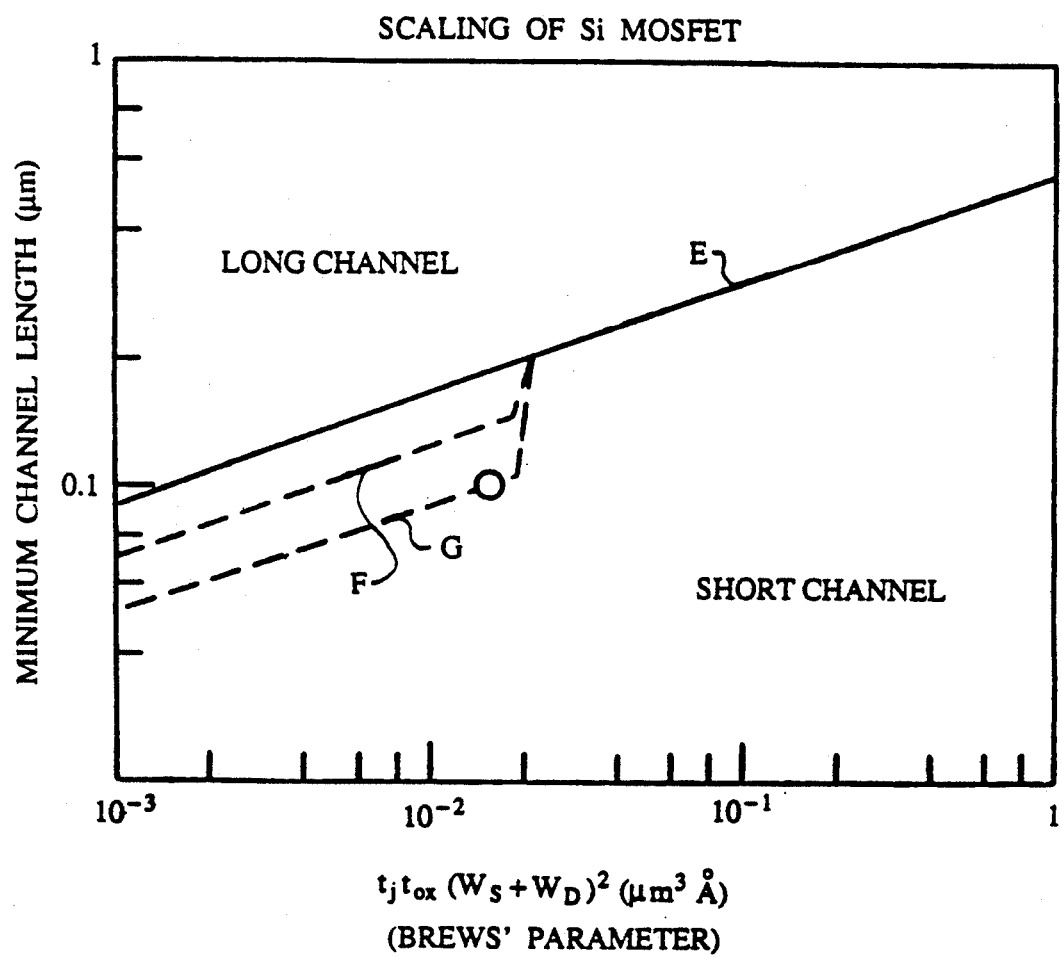
FIG. 4 is a graphical representation of a scaling rule for silicon MOSFETs which relates the minimum permissible channel length to structural dimensions of the transistor.

It should be further noted, in this regard, that a well-known empirical formula, described in J. R. Brews, et al., "Generalized Guide for MOSFET Miniaturization," *IEEE Electron Device Lett.* 1, (1980), p. 2, has been used to predict the smallest effective channel length $L_{min}$ that can be used without incurring undesirable short channel effects in MOSFETs of conventional, bulk-silicon design. Brews' formula is expressed by $$\log L_{min} = \log A + (\tfrac{1}{3})\log[t_j t_{ox}(w_s+w_d)^2], \quad (4)$$

where $t_j$ denotes the junction depth, A is a constant equal to 0.41 Å$^{-\frac{1}{3}}$, and $w_s$ and $w_d$ are the respective source and drain depletion widths. As shown in FIG. 4, a log-log plot of $L_{min}$, as predicted by this equation, against Brews' parameter (the argument of the logarithmic function in the right-hand side of the equation) yields a straight-line curve, labeled E in the figure. We have found that inventive MOSFETs can be designed such that at a given value of Brews' parameter, $L_{min}$ is less than 75% (curve F), and even as small as 60% or less (curve G), of the value predicted by Brews' formula.

EXAMPLE

We conducted a computer simulation of the PSD structure shown in FIG. 2, using a computer code capable of numerically solving the two-dimensional Poisson equation. In the modeled device, the junction depth was 500 Å, the compensated layer thickness $t_{Si}$ was 250 Å, the oxide thickness $t_{ox}$ was 40 Å, and the effective channel length $L_{eff}$ was 0.1 μm.

The scaling behavior of the modeled device is shown in FIG. 4 as the data point plotted on curve G. It is evident that $L_{min}$ is about 60% of the value predicted by Brews' formula.

Figure 5:
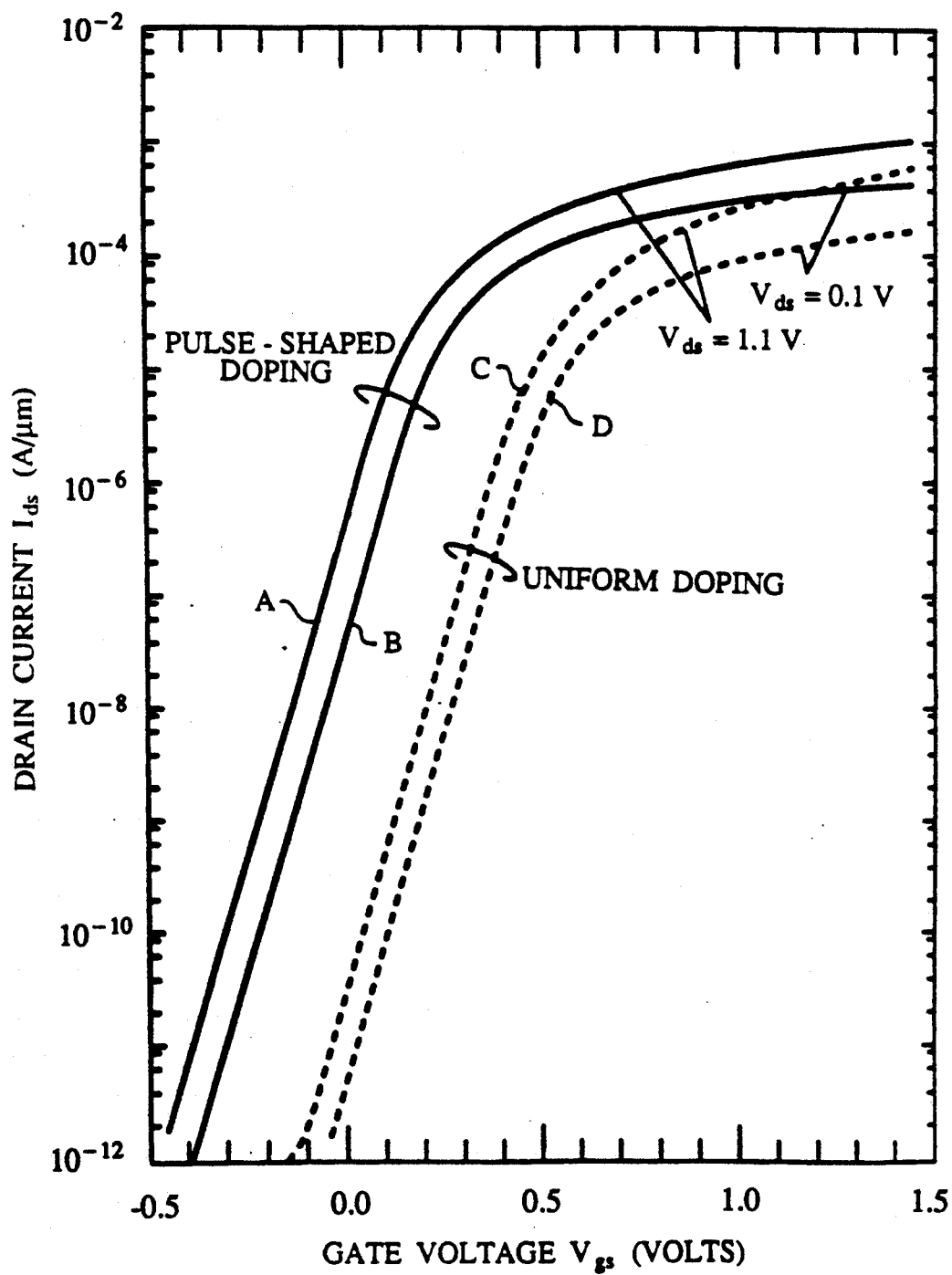
FIG. 5 is a graph of drain current versus gate voltage. Compared in the figure are a computer simulation of a MOSFET which has pulse-shaped doping according to the invention, and a MOSFET which has conventional, uniform doping.

Curves A and B of FIG. 5 show the drain current calculated as a function of gate voltage for that structure. Curve A corresponds to a drain-to-source bias of 1.1 V, and curve B corresponds to a bias of 0.1 V. Curves C and D of the same figure are presented for purposes of comparison. They represent the performance of a MOSFET structure uniformly doped at $10^{18}$ cm$^{-3}$, at respective biases of 1.1 V and 0.1 V. It is apparent from the figure that the subthreshold behavior of the uniform doping structure is preserved in the behavior of the PSD structure. The threshold voltage of the PSD structure is lower because of the reduced dopant concentration in the channel region, above the ground plane. In particular, the figure predicts that a threshold voltage less than about 0.6 V can be readily achieved in the inventive transistor structure. We have found, further, that the predicted junction capacitance of the PSD structure is less than one-third that of the corresponding uniformly doped structure.

We claim:

1. An integrated circuit formed on at least a portion of a silicon substrate having a principal surface, the integrated circuit comprising a MOSFET comprising: a gate oxide layer of thickness $t_{ox}$ overlying a portion of the substrate; a source region, and a drain region spaced from the source region, each defined in a portion of the substrate and extending to a junction depth $t_j$ beneath the principal surface and each having a first predominant carrier type; and first and second channel regions defined within the substrate and located between the source and drain regions, the first channel region at least partially overlying the second channel region, and the gate oxide layer overlying the first channel region, and the first and second channel regions being doped such that each has a second predominant carrier type opposite to the first carrier type, and the second channel region has a higher carrier density than the first channel region, characterized in that a) the first channel region extends from the principal surface to a depth, to be referred to as $t_{Si}$, which is less than or equal to about 500 Å,
  b) the second channel region extends substantially from $t_{Si}$ to a depth that is is less than or equal to about $t_j$,
  c) the room-temperature carrier density in the first channel region is less than about $2 \times 10^{17}$ cm$^{-3}$; and
  d) the room-temperature carrier density in the second channel region is greater than about $5 \times 10^{17}$ cm$^{-3}$.

2. The integrated circuit of claim 1, wherein the first channel region has an effective channel length which is equal to 0.15 μm or less.

3. The integrated circuit of claim 1, wherein the second channel region extends substantially to a depth that is less than or equal to about 1000 Å.

4. The integrated circuit of claim 1, wherein the gate oxide layer has a dielectric constant $\epsilon_{ox}$, the first channel region has a dielectric constant $\epsilon_{Si}$, the first channel region has an effective channel length $L_{eff}$, the MOSFET has a scale length λ defined by $$\lambda = \sqrt{\frac{\epsilon_{Si}}{2\epsilon_{ox}} \frac{t_{Si}t_{ox}}{1 + \frac{\epsilon_{Si}t_{ox}}{\epsilon_{ox}t_{Si}}}}$$

and $t_{ox}$ and $t_{Si}$ are selected such that λ is less than or equal to $0.2L_{eff}$.

5. The integrated circuit of claim 4, wherein $t_{ox}$ and $t_{Si}$ are further selected such that the MOSFET exhibits a threshold voltage which is less than about 0.6 volts.

* * * * *